(12) United States Patent
Tong et al.

(10) Patent No.: US 10,727,149 B2
(45) Date of Patent: Jul. 28, 2020

(54) THERMALLY SUPERCONDUCTING HEAT DISSIPATION DEVICE AND MANUFACTURING METHOD THEREOF

(71) Applicant: ZHEJIANG JIAXI OPTOELECTRONIC EQUIPMENT MANUFACTURING CO., LTD., Jiashan, Zhejiang (CN)

(72) Inventors: Aixing Tong, Zhejiang (CN); Zhengming Si, Zhejiang (CN)

(73) Assignee: ZHEJIANG JIAXI OPTOELECTRONIC EQUIPMENT MANUFACTURING CO., LTD., Yaozhuang Town, Jiashan, Zhejiang (CN)

( * ) Notice: Subject to any disclaimer, the term of this patent is extended or adjusted under 35 U.S.C. 154(b) by 178 days.

(21) Appl. No.: 15/739,989

(22) PCT Filed: Jul. 1, 2016

(86) PCT No.: PCT/CN2016/088096
§ 371 (c)(1),
(2) Date: Apr. 20, 2018

(87) PCT Pub. No.: WO2017/005138
PCT Pub. Date: Jan. 12, 2017

(65) Prior Publication Data
US 2018/0308780 A1   Oct. 25, 2018

(30) Foreign Application Priority Data

Jul. 3, 2015  (CN) .......................... 2015 1 0398422
Jul. 28, 2015 (CN) .......................... 2015 1 0452092

(51) Int. Cl.
*H01L 23/367*   (2006.01)
*H01L 23/473*   (2006.01)
(Continued)

(52) U.S. Cl.
CPC ........ *H01L 23/367* (2013.01); *F28D 15/0233* (2013.01); *F28D 15/0275* (2013.01);
(Continued)

(58) Field of Classification Search
CPC ... H01L 23/427; H01L 23/467; H01L 23/473; H01L 23/3672; H01L 21/4882;
(Continued)

(56) References Cited

U.S. PATENT DOCUMENTS 3,477,504 A * 11/1969 Colyer ................. F28F 13/003
                                                165/164
3,829,740 A *  8/1974 Beasley ............. H05K 7/20936
                                                361/697

(Continued)

FOREIGN PATENT DOCUMENTS

CN     201327002 Y    10/2009
CN     105140194 A    12/2015

*Primary Examiner* — Adam B Dravininkas
(74) *Attorney, Agent, or Firm* — Global IP Services; Tianhua Gu (57) ABSTRACT

A thermally superconducting radiator and a method for manufacturing the same. The thermally superconducting radiator comprises a plurality of separators and a plurality of thermally superconducting heat dissipation fins. The separators and the thermally superconducting heat dissipation fins are alternately arranged, and one end face of the separator is flush with one end face of the thermally superconducting heat dissipation fin, together forming a mounting surface suitable for mounting a power device. The thermally superconducting heat dissipation fins and the separators are fixedly connected. Replacing the conventional heat dissipation fins in the prior art with the thermally superconducting heat dissipation fins enables the thermally superconducting radiator to have a greater heat transfer rate and a more efficient fin efficiency. The fin efficiency of the heat dissi- (Continued)

pation fin is not affected by the height, which greatly improves the cooling capability of the radiator.

16 Claims, 7 Drawing Sheets (51) Int. Cl.

| | |
|---|---|
| *F28F 3/14* | (2006.01) |
| *H01L 23/373* | (2006.01) |
| *F28D 15/02* | (2006.01) |
| *F28F 3/06* | (2006.01) |
| *F28F 3/02* | (2006.01) |
| *H01L 39/24* | (2006.01) |
| *F28F 13/00* | (2006.01) |

(52) U.S. Cl.
CPC ............... *F28F 3/02* (2013.01); *F28F 3/06* (2013.01); *F28F 3/14* (2013.01); *H01L 23/373* (2013.01); *H01L 23/3733* (2013.01); *H01L 23/473* (2013.01); *H01L 39/24* (2013.01); *F28F 2013/001* (2013.01); *F28F 2215/06* (2013.01)

(58) Field of Classification Search
CPC . H01L 23/4006; H01L 23/367; H01L 23/373; H01L 35/30; H01L 23/36; F28D 15/0275; F28D 15/0233; F28D 15/0266; F28D 15/046; F28D 15/04; F28D 15/02; F28D 2021/0029; F28D 15/043; F28D 1/0233; H05K 7/20336; H05K 7/20154; H05K 1/0203; H05K 7/20254; H05K 7/2039; H05K 7/20263; H05K 7/20927; H05K 7/20272; H05K 7/20409; H05K 7/20418
See application file for complete search history.

(56) References Cited

U.S. PATENT DOCUMENTS

| | | | | |
|---|---|---|---|---|
| 4,184,862 | A * | 1/1980 | Waters | F28D 15/0275 165/162 |
| 4,971,144 | A * | 11/1990 | Gibson | F28F 3/12 165/170 |
| 5,365,400 | A * | 11/1994 | Ashiwake | H01L 23/433 165/80.4 |
| 5,381,859 | A * | 1/1995 | Minakami | F28F 3/02 165/80.3 |
| 6,269,865 | B1 * | 8/2001 | Huang | F28D 15/0266 165/104.26 |
| 6,942,019 | B2 * | 9/2005 | Pikovsky | F28F 3/12 165/170 |
| 7,417,857 | B2 * | 8/2008 | Rondier | H01L 23/473 165/104.33 |
| 7,770,407 | B1 * | 8/2010 | Haskell | F28D 15/0266 62/315 |
| 8,835,038 | B2 * | 9/2014 | Abels | H01M 2/1077 429/120 |
| 2005/0167085 | A1 * | 8/2005 | Chu | F28F 3/02 165/80.3 |
| 2012/0237805 | A1 * | 9/2012 | Abels | H01M 2/1077 429/83 |

* cited by examiner

THERMALLY SUPERCONDUCTING HEAT DISSIPATION DEVICE AND MANUFACTURING METHOD THEREOF

CROSS REFERENCE TO RELATED PATENT APPLICATION

The present application is the US national stage of PCT/CN2016/088096 filed on Jul. 1, 2016, which claims the priorities of the CN201510398422.3 filed on Jul. 3, 2015 and CN201510452092.1 filed on Jul. 28, 2015, which applications are incorporated herein by reference.

TECHNICAL FIELD

The present invention relates to a radiator for high-power electronic devices, and more particularly, to a thermally superconducting radiator and a method for manufacturing the same.

BACKGROUND

With the rapid development of power electronics technology, the integration level of high-power devices such as IGBTs (insulated gate bipolar transistors), diodes and thyristors is getting higher and higher, the power density thereof is also getting larger and larger, and the heat generated during operation is getting more and more. In order to ensure the normal operation of a power device, heat must be dissipated timely and effectively. Because if the heat generated by the power device cannot be quickly dissipated in time, the temperature of chips in the power device will be increased, which, at best, will cause performance degradation, and shortening of service life and, at worst, will results in failure of the power device and burning and explosion of the chip. Accordingly, how to solve the problem of heat dissipation in high-power devices is always one of core problems which plague manufacturers producing high-power encapsulation devices and manufacturers using the high-power encapsulation devices.

At present, a general method for heat-dissipating comprises forced air-cooled heat radiation and liquid-cooled heat radiation. Heat dissipation of power modules such as high-power SVG (static var generator), MVD (medium-high voltage inverter), UPS (uninterruptible power supply), PCS (power converter) uses the forced air-cooled heat radiation mode; and heat dissipation of power modules such as wind power converter and high-iron drive converter uses the liquid-cooled heat radiation mode.

Air-cooled radiators are typically aluminum-extruded radiators having multiple aluminum heat dissipation fins disposed on an aluminum alloy substrate, plug-in radiators and shovel radiators. Because the thermal conductivity of aluminum and aluminum alloy is less than 220 W/m·K, the fin efficiency of the heat dissipation fin is relatively low, and the thermal diffusivity thereof is poor, which cannot meet the heat dissipation requirement of high heat flux density high-power modules.

Liquid-cooled radiators are usually composed of heat-absorbing cold plates, circulating pumps, reservoirs, heat exchangers, connecting pipes and valves, etc. The system is complex, bulky, expensive, and has corrosion, fouling and antifreezing problems. Moreover, there are multiple connection heads in the system, which may result in problems of liquid leakage and system security.

Therefore, it is urgent to develop a general-purpose and efficient radiator which not only can meet the heat dissipation requirement of the high heat flux density high power modules, but also is efficient and reliable, small in size, high in cost performance and replaceable for liquid-cooled heat radiation.

SUMMARY

In view of the above-mentioned drawbacks of the prior art, an object of the present invention is to provide a thermally superconducting radiator and a method for manufacturing the same for solving the problem that a heat dissipation fin of air-cooled radiators existing in the prior art is inefficient and cannot satisfy the heat dissipation requirement as well as problems of complex systems, high cost and safety risk of liquid-cooled radiators, such that the fin efficiency and heat radiation capability of air-cooled radiators can be greatly improved to meet the heat dissipation demand of high-power modules.

In order to achieve the above and other related objects, the present invention provides a thermally superconducting radiator comprising a plurality of separators and a plurality of thermally superconducting heat dissipation fins; wherein the separators and the thermally superconducting heat dissipation fins are alternately arranged, and one end face of the separator is flush with one end face of the thermally superconducting heat dissipation fin, together forming a mounting surface suitable for mounting a power device.

The thermally superconducting heat dissipation fins are fixedly connected with the separators.

As a preferred embodiment of the thermally superconducting radiator of the present invention, the thermally superconducting heat dissipation fin comprises two plates which are compounded together by a rolling process. Closed pipes that are interconnected and have a certain structure and shape are formed between the two plates by an inflation process. In addition, convex structures corresponding to the closed pipes are formed on the surfaces of the two plates. The closed pipes are filled with a heat transfer working medium.

As a preferred embodiment of the thermally superconducting radiator of the present invention, the separator comprises side separators and an intermediate separator located between the side separators. Grooves are provided on the side of the side separators adjacent to the intermediate separator and on both sides of the intermediate separator, wherein the grooves are shaped to match the shapes of the convex structures of the thermally superconducting heat dissipation fins located between the separators. The convex structure of the thermally superconducting heat dissipation fin located between the separators is located within the groove.

As a preferred embodiment of the thermally superconducting radiator of the present invention, the closed pipe has a hexagonal honeycomb shape, a crisscrossed mesh shape, multiple U shapes connected from head to end in series, a rhombic structure, a triangular structure, a circular structure, or any combinations of any or more of the above.

As a preferred embodiment of the thermally superconducting radiator of the present invention, a part of the closed pipe is located between the separators. The closed pipe located between the separators comprises a first straight-edged sub-pipe and a second straight-edged sub-pipe. The first straight-edged sub-pipe is distributed along the length direction of the thermally superconducting heat dissipation fin, and the second straight-edged sub-pipe is vertically connected to both ends of the first straight-edged sub-pipe.

As a preferred embodiment of the thermally superconducting radiator of the present invention, the closed pipe located between the separators further comprises a cambered sub-pipe. The first straight-edged sub-pipe and the second straight-edged sub-pipe are connected with each other via the cambered sub-pipe.

As a preferred embodiment of the thermally superconducting radiator of the present invention, the thermally superconducting heat dissipation fins are plate-like phase change suppressing heat pipes or plate-like pulsating heat pipes.

As a preferred embodiment of the thermally superconducting radiator of the present invention, the material of the thermally superconducting heat dissipation fins and the separators is copper, a copper alloy, aluminum or an aluminum alloy, or any combinations of any one or more of the above.

As a preferred embodiment of the thermally superconducting radiator of the present invention, the thermally superconducting heat dissipation fins and the separators are fixedly connected via a lamination process, a heat-conducting adhesive bonding process, a brazing and welding process, a combination process of lamination and heat-conducting adhesive bonding, a combination process of lamination and brazing or a combination process of mechanical lamination and friction stirring and welding.

The present invention also provides a method for manufacturing a thermally superconducting radiator, the method comprising:

manufacturing thermally superconducting heat dissipation fins via an inflation process, so as to form closed pipes that are interconnected and have a certain structure and shape within the thermally superconducting heat dissipation fins, and form convex structures corresponding to the closed pipe on a surface of the thermally superconducting heat dissipation fins;

providing a plurality of separators, and alternately arranging the separators and the thermally superconducting heat dissipation fins, such that one end face of the thermally superconducting heat dissipation fin is flush with one end face of the separator; and fixedly connecting the thermally superconducting heat dissipation fins with the separators.

As a preferred embodiment of the method of manufacturing the thermally superconducting radiator of the present invention, the specific method of manufacturing the thermally superconducting heat dissipation fins via the inflation process is as follows:

providing two plates which are sheared into shapes and have the same thickness, and roughening and blowing one surface of the two plates clean;

forming graphite lines that are interconnected and have a certain shape on a roughened surface of at least one of the plates by means of a graphite printing method, the graphite lines defining the shape of the closed pipes;

fitting the roughened surfaces of the two plates together, aligning the roughened surfaces from three edges, and riveting the two plates long the edges;

heating the two plates riveted together to a certain temperature, maintaining the temperature for a period of time, and then performing hot rolling processing to form a composite plate;

softening and annealing the composite plate, and after cooling the composite plate to room temperature, drilling technical holes at positions of the plate that correspond to the graphite lines to a graphite layer;

filling the composite plate with a high pressure fluid through the technical holes to expand the composite plate, and forming pipes that are interconnected and have a certain shape within the composite plate upon formation of the convex structure on both surfaces of the composite plate;

injecting a heat transfer working medium into the pipes through the technical holes and sealing the technical holes.

As a preferred embodiment of the method for manufacturing a thermally superconducting radiator according to the present invention, the separator comprises side separators and an intermediate separator located between the side separators. Before alternately arranging the separators and the thermally superconducting heat the composite plate fins, the method further comprises a step of providing grooves on the side of the side separators adjacent to the intermediate separator and on both sides of the intermediate separator, the grooves being shaped to match the shapes of the convex structures located between the separators. The grooves are adapted to receive the convex structures when the separators and the thermal superconducting heat dissipation fins are alternately arranged.

As a preferred embodiment of the method for manufacturing a thermally superconducting radiator according to the present invention, the closed pipe has a hexagonal honeycomb shape, a crisscrossed mesh shape, multiple U shapes connected end to end in series, a rhombic structure, a triangular structure, a circular structure, or any combinations of any or more of the above.

As a preferred embodiment of the method for manufacturing the thermally superconducting radiator of the present invention, a part of the closed pipe is located between the separators. The closed pipe located between the separators comprises a first straight-edged sub-pipe and a second straight-edged sub-pipe. The first straight-edged sub-pipe is distributed along the length direction of the thermally superconducting heat the composite plate fin, and the second straight-edged sub-pipe is vertically connected to both ends of the first straight-edged sub-pipe.

As a preferred embodiment of the method for manufacturing the thermally superconducting radiator of the present invention, the closed pipe located between the separators further comprises a cambered sub-pipe. The first straight-edged sub-pipe and the second straight-edged sub-pipe are connected with each other via the cambered sub-pipe.

As a preferred embodiment of the method for manufacturing a thermally superconducting radiator according to the present invention, the thermally superconducting heat dissipation fins are plate-like phase change suppressing heat pipes or plate-like pulsating heat pipes.

A preferred embodiment of the method for producing a thermally superconducting radiator according to the present invention, the thermally superconducting heat dissipation fins and the separators are fixedly connected by a lamination process, a heat-conducting adhesive bonding process, a brazing and welding process, a combination process of lamination and heat-conducting adhesive bonding, a combination process of lamination and brazing or a combination process of mechanical lamination and friction stirring and welding.

As described above, the thermally superconducting radiator and the method for manufacturing the same of the present invention have the following advantageous effects:

1. Replacing the conventional heat dissipation fins in the prior art with the thermally superconducting heat dissipation fins enables the thermally superconducting radiator to have a greater heat transfer rate and a more efficient fin efficiency, and the fin efficiency of the thermally superconducting heat dissipation fins is up to 90%; moreover, the radiator almost does not change with the increase of the height of the heat dissipation fin and the increase of wind speed, which greatly improves the cooling capability and application range of the radiator.

2. With the separators and the thermal superconducting heat dissipation fins being alternately arranged and one end of the thermally superconducting heat dissipation fins being flush with a mounting surface of the radiator, a part of the heat generated by a power device mounted on the mounting surface during operation can be conducted to the thermally superconducting heat dissipation fins through the separators, and the other part of the heat is directly conducted to the thermally superconducting heat dissipation fins. The combination of the two conduction modes greatly improves the heat dissipation efficiency of the radiator.

3. The thermally superconducting radiator of the present invention is convenient and flexible in manufacturing, low in cost, large in heat dissipation capacity, light in weight and small in size; it can replace heat pipe radiators and a part of water-cooled radiators, and is especially suitable for the heat dissipation requirement of high power high heat flux density electronic devices. Accordingly, the thermally superconducting radiator of the present invention has a broad market prospect and a great economic value.

COMPONENT REFERENCE NUMBER DESCRIPTION 1 thermally superconducting heat dissipation fin
11 plate
12 closed pipe
13 convex structure
14 heat transfer working medium
15 non-piping part
16 first straight-edged sub-pipe
17 second straight-edged sub-pipe
18 cambered sub-pipe
2 intermediate separator
21 substrate
22 groove
3 side separator
4 power device

DETAILED DESCRIPTION OF THE PREFERRED EMBODIMENTS

Other advantages and effects of the present invention will be apparent to those skilled in the art from the following disclosure illustrating the embodiments of the present invention by using specific examples. The present invention may also be embodied or applied by additional different specific embodiments, and the details in this specification may be modified or varied on the basis of different views and applications without departing from the spirit of the invention.

Referring to FIGS. 1 to 14, it is to be noted that the figures provided in the embodiments only provide a schematic illustration of the basic concept of the present invention. Even though only components related to the present invention are shown in the figures and the figures are not drawn in accordance with the actual number, shapes and sizes of components during practical implementation, the forms, the number and the proportion of the components can be randomly changed during practical implementation, and the layout form of the components may be more complex.

Embodiment 1

Figure 1:
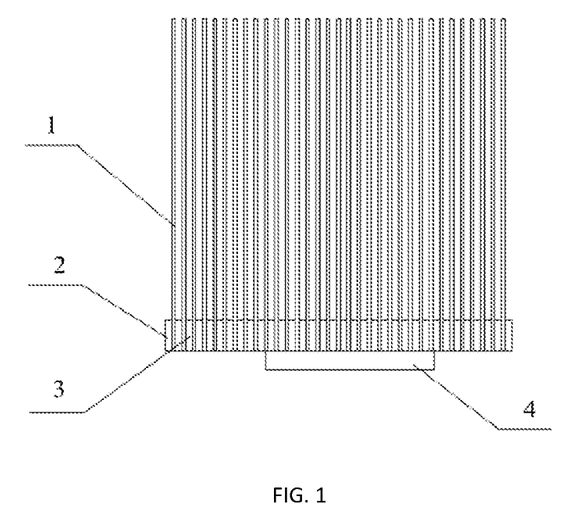
FIG. 1 shows a schematic view of a structure of a thermally superconducting radiator provided in embodiment 1 of the present invention.
Figure 2:
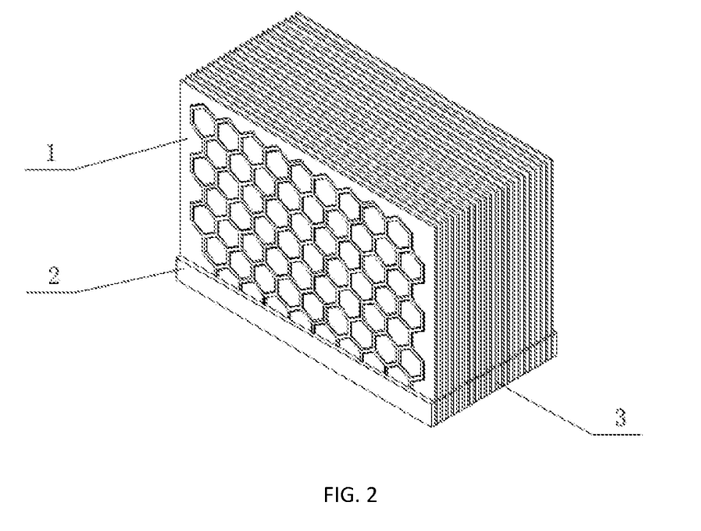
FIG. 2 shows a schematic view of a three-dimensional structure of the thermally superconducting radiator provided in embodiment 1 of the present invention.
Figure 3:
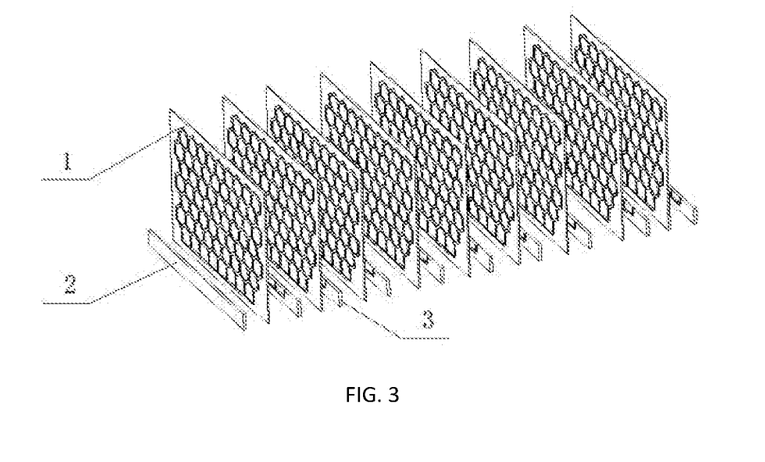
FIG. 3 shows a schematic view for assembling the three-dimensional structure of the thermally superconducting radiator provided in embodiment 1 of the present invention.

Referring to FIGS. 1 to 10, the present invention provides a thermally superconducting radiator comprising a plurality of separators and a plurality of thermally superconducting heat dissipation fins 1; wherein the separators and the thermally superconducting heat dissipation fins 1 are alternately arranged, and one end face of the separator is flush with one end face of the thermally superconducting heat dissipation fin 1, together forming a mounting surface suitable for mounting a power device; the separators and the thermally superconducting heat dissipation fin 1 located between the separators together constitute a substrate of the thermally superconducting radiator;

the thermally superconducting heat dissipation fins 1 are fixedly connected with the separators.

Figure 4:
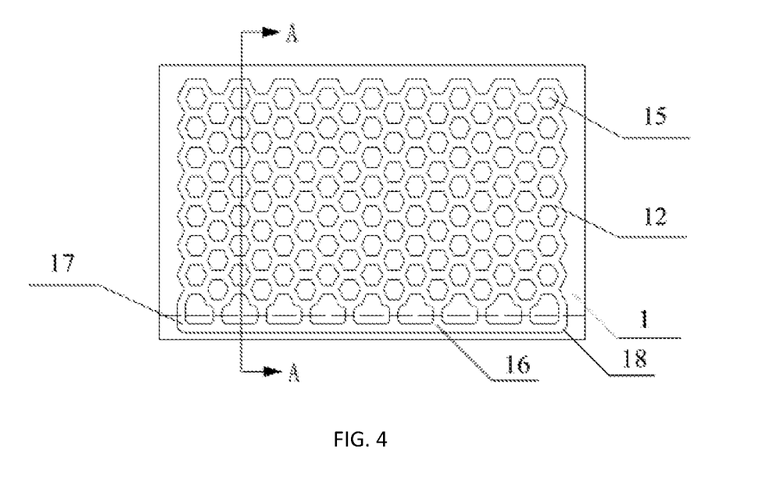
FIG. 4 shows a schematic view of a structure of a pipeline of thermally superconducting heat dissipation fins in the thermally superconducting radiator provided in embodiment 1 of the present invention.
Figure 5:
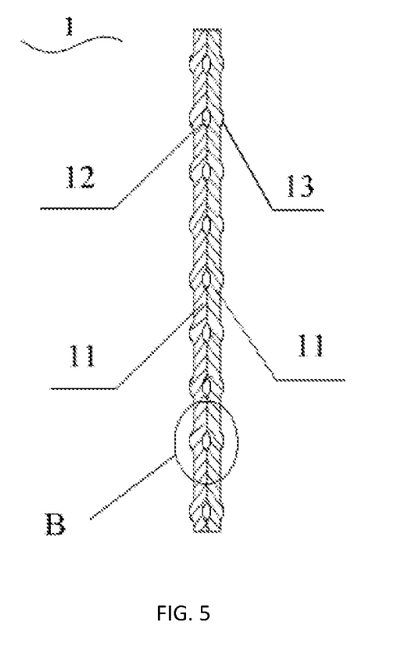
FIG. 5 shows a schematic view of a structure of a cross section of FIG. 2 in AA direction.
Figure 6:
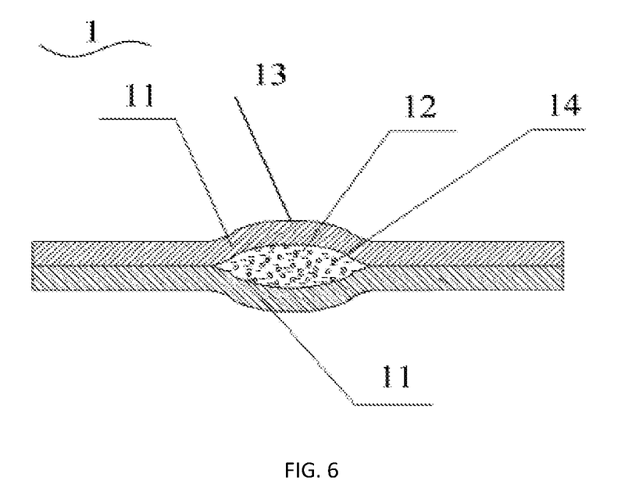
FIG. 6 shows an enlarged schematic view of area B in FIG. 3.
Figure 7:
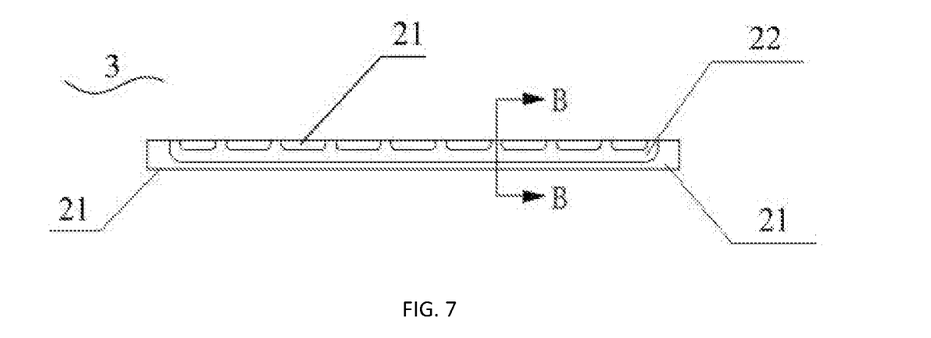
FIG. 7 shows a schematic view of a structure of an intermediate separator in the thermally superconducting radiator provided in embodiment 1 of the present invention.
Figure 8:
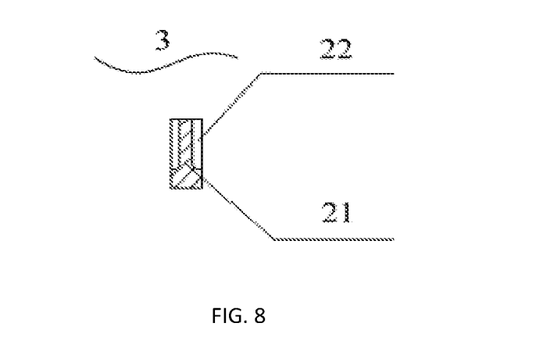
FIG. 8 shows a schematic view of a structure of a cross section of FIG. 5 in BB direction.
Figure 9:
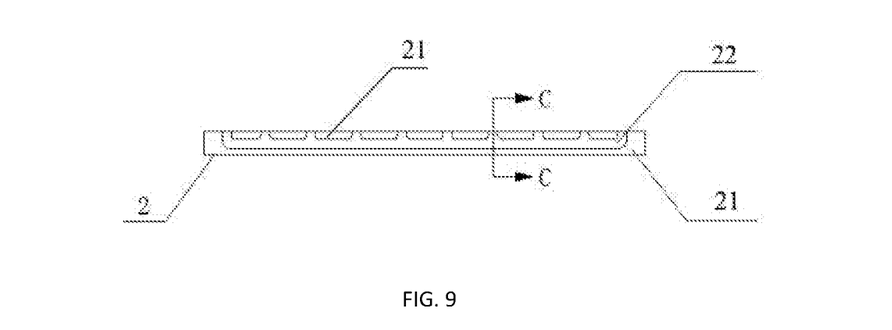
FIG. 9 shows a schematic view of a structure of a side separator in the thermally superconducting radiator provided in embodiment 1 of the present invention.
Figure 10:
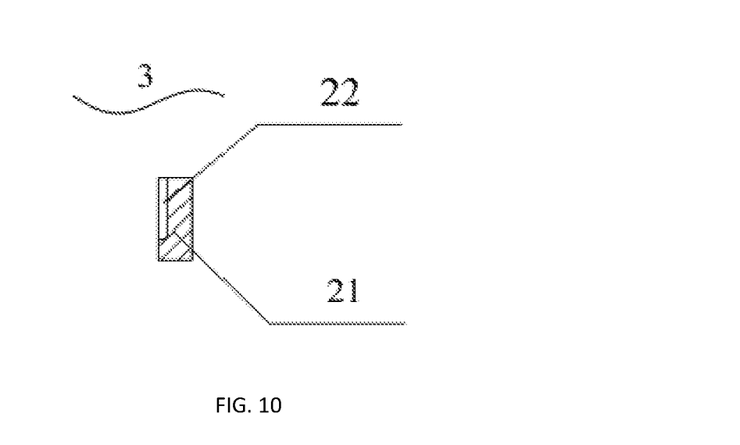
FIG. 10 shows a schematic view of a structure of a cross section of FIG. 7 in CC direction.

As an example, referring to FIGS. 4 to 6 in conjunction with FIGS. 1 to 3, the thermally superconducting heat dissipation fins 1 comprise two plates 11 which are compounded together via a rolling process. Closed pipes 12 that are interconnected and have a certain structure and shape are formed between the two plates 11 via an inflation process, and convex structures 13 corresponding to the closed pipes 12 are formed on the surfaces of the two plates 11 with. The closed pipes 12 are filled with a heat transfer working medium 14.

As an example, the heat transfer working fluid 14 is a fluid; preferably, the heat transfer working fluid 14 is gas, liquid or a mixture of liquid and gas; and more preferably, in the present embodiment, the heat transfer working medium 14 is a mixture of liquid and gas.

As an example, the thermally superconducting heat dissipation fins 1 may be plate-like phase change suppressing heat pipes or plate pulsating heat pipes.

By replacing the conventional heat dissipation fins of the prior art with the thermally superconducting heat dissipation fins 1, the thermally superconducting radiator has a greater heat transfer rate and a higher fin efficiency, and the fin efficiency of the heat dissipation fins is not affected by the height of the heat dissipation fins, which greatly improves the heat dissipation capability of the radiator. With the separators and the thermally superconducting heat dissipation fins 1 being alternately arranged and one end of the thermally superconducting heat dissipation fins 1 being flush with a mounting surface of the radiator, a part of the heat generated by the power device 4 mounted on the mounting surface during operation can be conducted to the thermally superconducting heat dissipation fins 1 through the separators, and the other part of the heat is directly conducted to the thermally superconducting heat dissipation fins 1. The combination of two conduction modes significantly improves the heat dissipation efficiency of the radiator.

As an example, referring to FIGS. 7 to 10 in conjunction with FIGS. 1 to 3, the separator comprises side separators 3 and an intermediate separator 2 located between the side separators 3. Grooves 22 are provided on a side of the side separators 3 adjacent to the intermediate separator 2 and on both sides of the intermediate separator 2. The grooves 22 are shaped to match the shape of the convex structures 13 located between the separators. The convex structures 13 located between the separators are located within the grooves 22. The shape of the grooves 22 is designed to match the shape of the convex structures 13 located between the separators, such that the separators and the thermally superconducting heat dissipation fins 1 can be closely fitted when alternately arranged. The separators and the thermally superconducting heat dissipation fins 1 are well engaged after fitting, and have good thermal conductivity and high mechanical strength.

As an example, the depth of the groove 22 (i.e., the size in a direction perpendicular to the surface of the separator) is smaller than the thickness of the separator (i.e., the substrate 21 in FIGS. 7 to 10); the shape and the depth the groove 22 match with the shape and the protruded height of a partially protruded structure of the thermally superconducting heat dissipation fins 1.

As an example, referring to FIG. 4 in combination with FIGS. 1 to 3, the closed pipe 12 has a hexagonal honeycomb shape. The hexagonal part in FIG. 4 is a non-piping part 15, the structures which surround each hexagon and are interconnected are the closed pipes 12.

As an example, the closed pipes 12 are located between the separators. In FIG. 4, the part below a dashed line is a part combined by the thermally superconducting heat dissipation fin 1 and the separator, i.e., the closed pipe 12 below the dashed line is the closed pipe located between the separators. The closed pipe 12 located between the separators comprises a first straight-edged sub-pipe 16 and a second straight-edged sub-pipe 17, wherein the first straight-edged sub-pipe 16 is distributed along the length direction of the thermally superconducting heat dissipation fin 1, and the second straight-edged sub-pipe 17 is located at both ends of the first straight-edged sub-pipe and is vertically connected to both ends of the first straight-edged sub-pipe.

It is to be noted that a corresponding plane of the thermally superconducting heat dissipation fin 1 in FIG. 4 corresponds to a plane in the leftward direction in FIG. 1, and the length direction of the thermally superconducting heat dissipation fin 1 corresponds to the length direction of the separator in FIG. 1. The length direction of the second straight-edged sub-pipe 17 corresponds to the height direction of the thermally superconducting heat dissipation fin 1, i.e., the direction perpendicular to the surface of the radiator substrate in FIG. 1.

As an example, the closed pipe 12 located between the separators further comprises a camber sub-pipe 18 located between the first straight-edged sub-pipe 16 and the second straight-edged sub-pipe 17. The first straight-edged sub-pipe 16 and the second straight-edged sub-pipe 17 are connected with each other via the cambered sub-pipe 18.

The closed pipe 12 located between the separators is provided as a straight-shaped pipe, i.e., the closed pipe 12 located on the bottom and at both ends of the bottom of the thermally superconducting heat dissipation fins 1 is provided to be straight-shaped. This facilitates the turning on a mold to process the grooves 22 on both sides of the separator, such a design allows the thermally superconducting heat dissipation fin 1 to easily cooperate with the separator and the process is easy to achieve, so that the grooves 22 and the convex structures 13 are closely fitted. The grooves 22 and the convex structures 13 are well engaged after fitting, and have good thermal conductivity and high mechanical strength.

As an example, the material of the thermally superconducting heat dissipation fin 1 and the material of the separator should be a material having better thermal conductivity; preferably, in the present embodiment, both the material of the thermally superconducting heat dissipation fin 1 and the material of the separator may be copper, a copper alloy, aluminum or an aluminum alloy, or any combinations of any one or more of the above. The material of the thermally superconducting heat dissipation fin 1 may be the same as or different from the material of the separator; preferably, in the present embodiment, the material of the thermally superconducting heat dissipation fin 1 is the same as the material of the separator.

As an example, the thermally superconducting heat dissipation fins 1 and the separators can be fixedly connected by a lamination process, a heat-conducting adhesive bonding process, a brazing and welding process, a combination process of lamination and heat-conducting adhesive bonding, a combination process of lamination and brazing or a combination process of mechanical lamination and friction stirring and welding. Preferably, in the present embodiment, the thermally superconducting heat dissipation fins 1 and the separators are laminated together via a lamination process. The thermally superconducting heat dissipation fins 1 and the separators are laminated together via a lamination process and fixedly connected with each other without using other material, which effectively reduces the thermal resistance of the radiator and further improves the heat dissipation efficiency of the radiator.

The working principle of the thermally superconducting radiator of the present invention is as follows: with the aid of rapid thermal conductivity characteristic of the thermally superconducting heat dissipation fins 1, a part of the heat generated by a power device fixed on the plane of the radiator substrate during operation is conducted to the thermally superconducting heat dissipation fins 1 through the separators, and the other part of the heat is directly conducted to the thermally superconducting heat dissipation fins 1. The heat transfer working medium 14 in the closed pipes 12 within the thermally superconducting heat dissipation fins 1 rapidly transfers the heat to the entire surface of the thermally superconducting heat dissipation fins 1, and then the heat is carried away by the air flowing through the gap of the thermally superconducting heat dissipation fins 1. Throughout the process of heat dissipation, the heat transfer rate of the thermally superconducting heat dissipation fins 1 is high, the temperature thereof is uniform and the fin efficiency thereof is high; in addition, the fin efficiency of the thermally superconducting heat dissipation fins 1 does not vary with the height of the thermally superconducting heat dissipation fins, which greatly improves the heat dissipation capability of the radiator.

Embodiment 2

Figure 11:
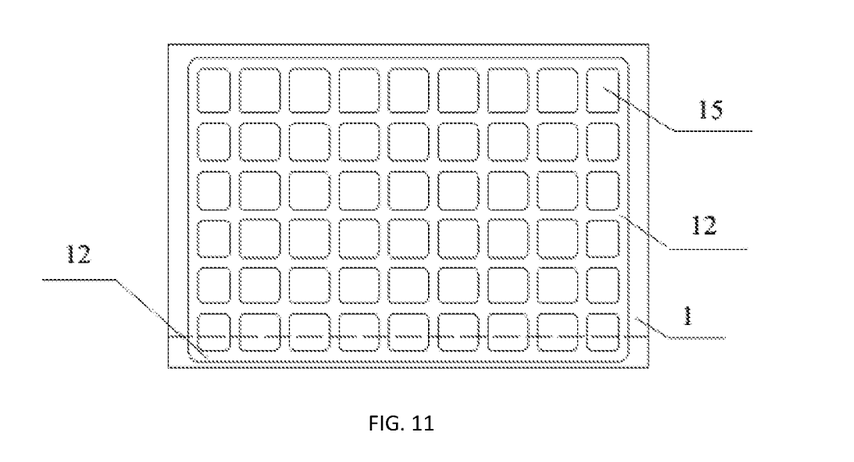
FIG. 11 shows a schematic view of a structure of a pipeline of a thermally superconducting heat dissipation fin in a thermally superconducting radiator provided in embodiment 2 of the present invention.

Referring to FIG. 11, the present invention further provides a thermally superconducting radiator. The structure of the thermally superconducting radiator in this embodiment is substantially the same as that of the thermally superconducting radiator described in embodiment 1. The two thermally superconducting radiator differs in that: in the present embodiment, the shape of the closed pipes 12 in the thermally superconducting heat dissipation fins 1 is a crisscrossed mesh shape. The quadrilaterals in FIG. 11 are non-piping parts 15, and the structures that surround each of the quadrilaterals and are interconnected are the closed pipes 12.

The other structures and features of the thermally superconducting radiator in this embodiment are the same as those of the thermally superconducting radiator described in embodiment 1. Please refer to embodiment 1 for details, and it will not be repeated herein.

Embodiment 3

Figure 12:
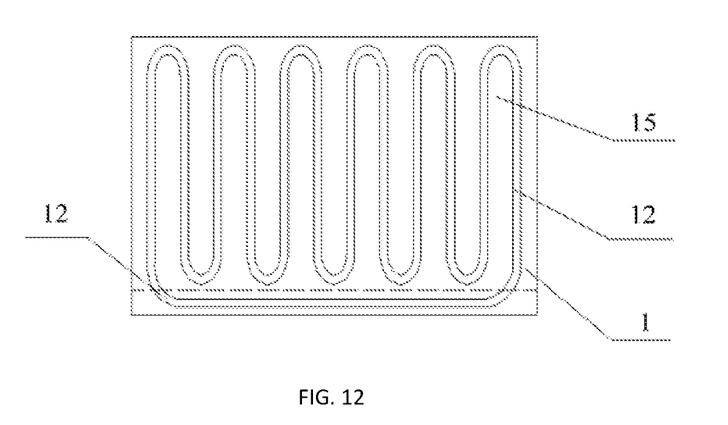
FIG. 12 shows a schematic view of a structure of a pipeline of a thermally superconducting heat dissipation fin in a thermally superconducting radiator provided in embodiment 3 of the present invention.

Referring to FIG. 12, the present embodiment further provides a thermally superconducting radiator. The structure of the thermally superconducting radiator in this embodiment is substantially the same as that of the thermally superconducting radiator described in embodiment 1. The two thermally superconducting radiator differ in that: in the present embodiment, the shape of the closed pipes 12 in the thermally superconducting heat dissipation fins 1 is multiple U shapes connected from head to end in series, i.e., in the present invention, the shape of the closed pipes 12 is formed by multiple U shapes connected from head to end. The part below the dashed line in FIG. 12 is a part combined by the thermally superconducting heat dissipation fin l and the separator, i.e., the part located between the separators. In the figure, the structure of the multiple U shapes connected with each other is the closed pipe 12, and the part located between the closed pipes 12 is the non-piping part 15. The length direction of the dashed line is the length direction of the thermally superconducting heat dissipation fin 1, and both ends of the dashed line correspond to both ends of the thermally superconducting heat dissipation fin 1. The U-shaped pipes located at both ends of the thermally superconducting heat dissipation fin 1 are connected with each other via a pipe located between the separators, such that closed connection of the entire closed pipe 12 can be achieved.

The other structures and features of the thermally superconducting radiator in this embodiment are the same as those of the thermally superconducting radiator described in embodiment 1. Please refer to embodiment 1 for details, and it will not be repeated herein.

Embodiment 4

Figure 13:
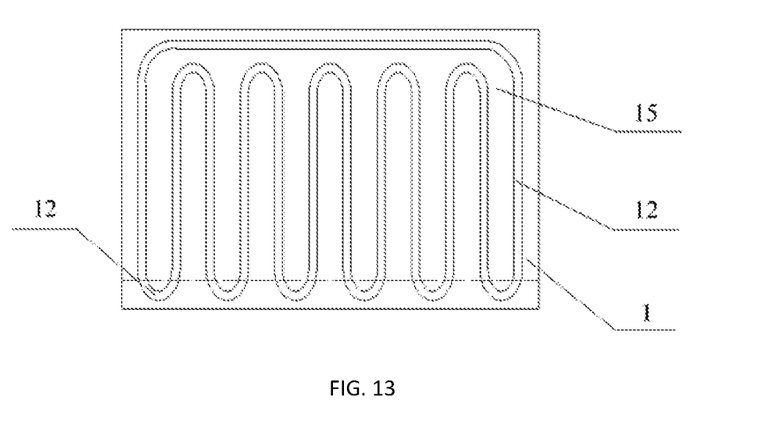
FIG. 13 shows a schematic view of a structure of a pipeline of a thermally superconducting heat dissipation fin in a thermally superconducting radiator provided in embodiment 4 of the present invention.

Referring to FIG. 13, the present embodiment further provides a thermally superconducting radiator. The structure of the thermally superconducting radiator in this embodiment is substantially the same as that of the thermally superconducting radiator described in embodiment 3. The two thermally superconducting radiators differ in that: in this embodiment, the U-shaped pipes located at both ends of the thermally superconducting heat dissipation fin 1 are connected with each other via a pipe located at the top of the thermally superconducting heat dissipation fin 1 to achieve closed connection of the entire closed pipes 12, i.e., the shape of the closed pipes 12 in this embodiment is equivalent to that of the closed pipes 12 described in embodiment 3 rotated by 180°.

All the other structures and features of the thermally superconducting radiator in this embodiment are the same as those of the thermally superconducting radiator described in embodiment 1. Please refer to embodiment 1 for details, and it will not be repeated herein.

It should be noted that the above-described embodiments only exemplify three examples of the closed pipe 12, i.e., the hexagonal honeycomb shape, the crisscrossed mesh shape and multiple U shapes connected from head to end in series. However, the shape of the closed pipe 12 is not limited to these three examples, but may also be a rhombic structure, a triangular structure, a circular structure, or any combinations of any or more of the above.

Embodiment 5

Figure 14:
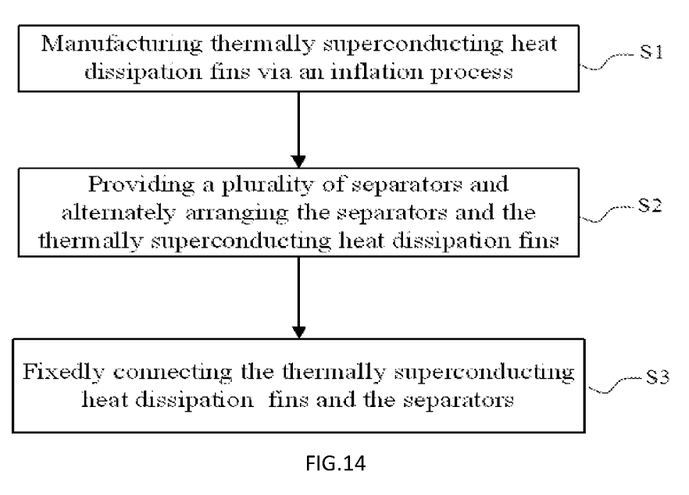
FIG. 14 shows a flowchart of a method for manufacturing a thermally superconducting radiator provided in embodiment 5 of the present invention.

Referring to FIG. 14, the present invention also provides a method for manufacturing a thermally superconducting radiator, the manufacturing method comprising:

S1: manufacturing thermally superconducting heat dissipation fins via an inflation process to form closed pipes that are interconnected and have a certain structure and shape within the thermally superconducting heat dissipation fins and to form convex structures corresponding to the closed pipe on a surface of the thermally superconducting heat dissipation fins;

S2: providing a plurality of separators, and alternately arranging the separators and the thermally superconducting heat dissipation fins, such that one end face of the thermally superconducting heat dissipation fin is flush with one end face of the separator;

S3: fixedly connecting the thermally superconducting heat dissipation fins with the separators.

Step S1 is performed. Referring to step S1 in FIG. 14, the thermally superconducting heat dissipation fins are manufactured via an inflation process to form closed pipes that are interconnected and have a certain structure and shape within the thermally superconducting heat dissipation fins and to form convex structures corresponding to the closed pipe on a surface of the thermally superconducting heat dissipation fin.

As an example, the specific method for manufacturing the thermally superconducting heat dissipation fins via the inflation process is as follows:

S11: providing two plates which are sheared into shapes and have the same thickness, and roughening and blowing one surface of the two plates clean;

S12: forming graphite lines that are interconnected and have a certain shape on a roughened surface of at least one of the plates by means of a graphite printing method, the graphite lines defining the shape of the closed pipes;

S13: fitting the roughened surfaces of the two plates together, aligning the roughened surfaces from three edges, and riveting the two plates along the edges;

S14: heating the two plates riveted together to a certain temperature, maintaining the temperature for a period of time, and then performing hot rolling processing to form a composite plate;

S15: softening and annealing the composite plate, and after the composite plate cools to a room temperature, drilling technical holes at positions of the plate that correspond to the graphite lines to a graphite layer;

S16: filling the composite plate with a high pressure fluid through the technical holes to expand the composite plate, and forming pipes that are interconnected and have a certain shape within the composite plate upon formation of the convex structures on both surfaces of the composite plate;

S17: injecting a heat transfer working medium into the pipes through the technical holes, and sealing the technical holes.

As an example, the closed pipe has a hexagonal honeycomb shape, a crisscrossed mesh shape, multiple U shapes connected end to end in series, a rhombic structure, a triangular structure, a circular structure, or any combinations of any or more of the above. In other words, the shape of the closed pipe can be a hexagonal honeycomb shape, a crisscrossed mesh shape, multiple U shapes connected end to end in series, a rhombic structure, a triangular structure, a circular structure, a combination of a hexagonal honeycomb shape and a crisscrossed mesh shape, and a combination of a hexagonal honeycomb shape, a circular structure and a crisscrossed mesh shape.

As an example, the thermally superconducting heat dissipation fins are plate-like phase change suppressing heat pipes or plate-like pulsating heat pipes.

Step S2 is performed. Referring to step S2 in FIG. 14, a plurality of separators are provided, and the separators and the thermally superconducting heat dissipation fins are alternately arranged such that one end face of the thermally superconducting heat dissipation fin is flush with one end face of the separator.

As an example, the separator comprises side separators and an intermediate separator located between the side separators. Before alternately arranging the separators and the thermally superconducting heat dissipation fins, the method further comprises a step of providing grooves on the side of the side separators adjacent to the intermediate separator and on both sides of the intermediate separator, the grooves being shaped to match the shapes of the convex structures located between the separators. The grooves are adapted to hold the convex structures located between the separators when the separators and the thermally superconducting heat dissipation fins are alternately arranged.

As an example, the closed pipe is located between the separators, and the closed pipe located between the separators comprises a first straight-edged sub-pipe and a second straight-edged sub-pipe. The first straight-edged sub-pipe is distributed along the length direction of the thermally superconducting heat dissipation fin, and the second straight-edged sub-pipe is vertically connected to both ends of the first straight-edged sub-pipe.

As an example, the closed pipe located between the separators further comprises a cambered sub-pipe, and the first straight-edged sub-pipe and the second straight-edged sub-pipe are connected with each other via the cambered sub-pipe.

As an example, the material of the thermally superconducting heat dissipation fin 1 and the material of the separator should be a material having better thermal conductivity; preferably, in the present embodiment, both the material of the thermally superconducting heat dissipation fin 1 and the material of the separator may be copper, a copper alloy, aluminum or an aluminum alloy, or any combinations of any one or more of the above. The material of the thermally superconducting heat dissipation fin may be the same as or different from the material of the separator; preferably, in the present embodiment, the material of the thermally superconducting heat dissipation fin is the same as the material of the separator.

Step S3 is performed. Referring to step S3 in FIG. 14, the thermally superconducting heat dissipation fins are fixedly connected with the separators.

As an example, the thermally superconducting heat dissipation fins and the separators are fixedly connected by a lamination process, a heat-conducting adhesive bonding process, a brazing and welding process, a combination process of lamination and heat-conducting adhesive bonding, a combination process of lamination and brazing or a combination process of mechanical lamination and friction stirring and welding. Preferably, in the present embodiment, the thermally superconducting heat dissipation fins are fixedly connected with the separators via a lamination process; the thermally superconducting heat dissipation fins are fixedly connected with the separators without using other materials, which can effectively reduce the thermal resistance of the radiator and further improve the heat radiation efficiency of the radiator.

In view of the above, the present invention provides a thermally superconducting radiator and a method for manufacturing the same. By replacing the conventional heat dissipation fins in the prior art with the thermally superconducting heat dissipation fins, the thermally superconducting radiator has a greater heat transfer rate and a higher fin efficiency, and the fin efficiency of the heat dissipation fins is not affected by the height of the heat dissipation fins, which greatly improves the heat dissipation capability of the radiator. With the separators and the thermally superconducting heat dissipation fins being alternately arranged and one end of the thermally superconducting heat dissipation fin being flush with a mounting surface of the radiator, a part of the heat generated by the power device mounted on the mounting surface during operation can be conducted to the thermally superconducting heat dissipation fins through the separators, and the other part of the heat is directly conducted to the thermally superconducting heat dissipation fins. The combination of the two conduction modes significantly improves the heat radiation efficiency of the radiator. The thermally superconducting radiator of the present invention is convenient and flexible in manufacturing, low in cost, large in heat radiation capacity, light in weight and small in size, can replace heat pipe radiators and a part of water-cooled radiators, is particularly suitable for the heat radiation requirement of high power high heat flow flux density electronic devices, and thus has a broad market prospect and a great economic value.

The above-described embodiments merely illustrate the principles and effects of the present invention and are not intended to limit the invention. Persons skilled in the art will be able to modify or alter the above-described embodiments without departing from the spirit and scope of the invention. Accordingly, all equivalents or modifications that are made by those ordinarily skilled in the art without departing from the spirit and technical concept disclosed in the present invention are intended to be embraced by the claims of the present invention.

What is claimed is:

1. A thermally superconducting radiator, characterized in that, the thermally superconducting radiator comprises: a plurality of separators and a plurality of thermally superconducting heat dissipation fins;

the separators and the thermally superconducting heat dissipation fins are alternately arranged, and one end face of the separator is flush with one end face of the thermally superconducting heat dissipation fin, together forming a mounting surface suitable for mounting a power device;

the thermally superconducting heat dissipation fins are fixedly connected with the separators wherein the thermally superconducting heat dissipation fins comprise two plates which are compounded together via a rolling process, closed pipes that are interconnected and have a certain structure and shape are formed between the two plates via an inflation process, and convex structures corresponding to the closed pipes are formed on the surfaces of the two plates; and the closed pipes are filled with a heat transfer working medium.

2. The thermally superconducting radiator according to claim 1, characterized in that, the separators comprise side separators and an intermediate separator located between the side separators;

grooves are provided on one side of the side separators adjacent to the intermediate separator and on both sides of the intermediate separator, the grooves being shaped to match the shapes of the convex structures of the thermally superconducting heat dissipation fins located between the separators;

the convex structures of the thermally superconducting heat dissipation fins located between the separators are located within the grooves.

3. The thermally superconducting radiator according to claim 1, characterized in that, the closed pipe has a hexagonal honeycomb shape, a crisscrossed mesh shape, multiple U shapes connected from head to end in series, a rhombic structure, a triangular structure, a circular structure, or any combination of any or more of the above.

4. The thermally superconducting radiator according to claim 1, characterized in that, a part of the closed pipe is located between the separators, the closed pipe located between the separators comprises a first straight-edged sub-pipe and a second straight-edged sub-pipe, the first straight-edged sub-pipe is distributed along the length direction of the thermally superconducting heat dissipation fin, and the second straight-edged sub-pipe is vertically connected to both ends of the first straight-edged sub-pipe.

5. The thermally superconducting radiator according to claim 4, characterized in that, the closed pipe located between the separators further comprises a cambered sub-pipe, the first straight-edged sub-pipe and the second straight-edged sub-pipe are connected with each other via the cambered sub-pipe.

6. The thermally superconducting radiator according to claim 1, characterized in that, the thermally superconducting heat dissipation fins are plate-like phase change suppressing heat pipes or plate-like pulsating heat pipes.

7. The thermally superconducting radiator according to claim 1, characterized in that, the material of the thermally superconducting heat dissipation fin and the separator is copper, a copper alloy, aluminum or an aluminum alloy, or any combination of any one or more of the above.

8. The thermally superconducting radiator according to claim 1, characterized in that, the thermally superconducting heat dissipation fins and the separators are fixedly connected via a lamination process, a heat-conducting adhesive bonding process, a brazing and welding process, a combination process of lamination and heat-conducting adhesive bonding, a combination process of lamination and brazing or a combination process of mechanical lamination and friction stirring and welding.

9. A method for manufacturing a thermally superconducting radiator of claim 1, characterized in that, the manufacturing method comprises:

manufacturing thermally superconducting heat dissipation fins via an inflation process to form closed pipes that are interconnected and have a certain structure and shape within the thermally superconducting heat dissipation fins and to form convex structures corresponding to the closed pipe on a surface of the thermally superconducting heat dissipation fins;

providing a plurality of separators, and alternately arranging the separators and the thermally superconducting heat dissipation fins, such that one end face of the thermally superconducting heat dissipation fin is flush with one end face of the separator;

fixedly connecting the thermally superconducting heat dissipation fins with the separators.

10. The method for manufacturing a thermally superconducting radiator according to claim 9, characterized in that, the specific method for manufacturing the thermally superconducting heat dissipation fins via the inflation process is as follows:

providing two plates which are sheared into shapes and have the same thickness, and roughening and blowing one surface of the two plates clean;

forming graphite lines that are interconnected and have a certain shape on a roughened surface of at least one of the plates by means of a graphite printing method, the graphite lines defining the shape of the closed pipes;

fitting the roughened surfaces of the two plates together, aligning three edges, and riveting the two plates long the edges;

heating the two plates riveted together to a certain temperature, maintaining the temperature for a period of time, and then performing hot rolling processing to form a composite plate;

softening and annealing the composite plate, and after the composite plate cools to room temperature, drilling technical holes at positions of the plate that correspond to the graphite lines to a graphite layer;

filling the composite plate with a high pressure fluid through the technical holes to expand the composite plate, and forming pipes that are interconnected and have a certain shape within the composite plate upon formation of the convex structure on both surfaces of the composite plate;

injecting a heat transfer working medium into the pipes through the technical holes and sealing the technical holes.

11. The method for manufacturing a thermally superconducting radiator according to claim 9, characterized in that, the separators comprise side separators and an intermediate separator located between the side separators;

before alternately arranging the separators and the thermally superconducting heat dissipation fins, the method further comprises a step of providing grooves on one side of the side separators adjacent to the intermediate separator and on both sides of the intermediate separator, the grooves being shaped to match the shapes of the convex structures located between the separators, and the grooves being adapted to receive the convex structures when the separators and the thermally superconducting heat dissipation fins are alternately arranged.

12. The method for manufacturing a thermally superconducting radiator according to claim 9, characterized in that, the closed pipe has a hexagonal honeycomb shape, a criss-crossed mesh shape, multiple U shapes connected end to end in series, a rhombic structure, a triangular structure, a circular structure, or any combination of any or more of the above.

13. The method for manufacturing a thermally superconducting radiator according to claim 9, characterized in that, a part of the closed pipe is located between the separators, the closed pipe located between the separators comprises a first straight-edged sub-pipe and a second straight-edged sub-pipe, the first straight-edged sub-pipe is distributed along the length direction of the thermally superconducting heat dissipation fin, and the second straight-edged sub-pipe is vertically connected to both ends of the first straight-edged sub-pipe.

14. The method for manufacturing a thermally superconducting radiator according to claim 9, characterized in that, the closed pipe of the thermally superconducting heat dissipation fins located between the separators further comprises a cambered sub-pipe, and the first straight-edged sub-pipe and the second straight-edged sub-pipe are connected with each other via the cambered sub-pipe.

15. The method for manufacturing a thermally superconducting radiator according to claim 9, characterized in that, the thermally superconducting heat dissipation fins are plate-like phase change suppressing heat pipes or plate-like pulsating heat pipes.

16. The method for manufacturing a thermally superconducting radiator according to claim 9, characterized in that, the thermally superconducting heat dissipation fins and the separators are fixedly connected by a lamination process, a heat-conducting adhesive bonding process, a brazing and welding process, a combination process of lamination and heat-conducting adhesive bonding, a combination process of lamination and brazing or a combination process of mechanical lamination and friction stirring and welding.

\* \* \* \* \*